United States Patent
Narayanan et al.

(10) Patent No.: US 11,038,520 B1
(45) Date of Patent: Jun. 15, 2021

(54) ANALOG-TO-DIGITAL CONVERSION WITH RECONFIGURABLE FUNCTION MAPPING FOR NEURAL NETWORKS ACTIVATION FUNCTION ACCELERATION

(71) Applicants: INTERNATIONAL BUSINESS MACHINES CORPORATION, Armonk, NY (US); POLYTECHNIC UNIVERSITY OF TURIN, Turin (IT)

(72) Inventors: Pritish Narayanan, San Jose, CA (US); Giorgio Cristiano, Zurich (CH); Massimo Giordano, Mondovi (IT); Geoffrey Burr, Cupertino, CA (US)

(73) Assignees: International Business Machines Corporation, Armonk, NY (US); Polytechnic University Of Turin, Turin (IT)

( * ) Notice: Subject to any disclaimer, the term of this patent is extended or adjusted under 35 U.S.C. 154(b) by 0 days.

(21) Appl. No.: 16/849,239

(22) Filed: Apr. 15, 2020

(51) Int. Cl.
*H03M 1/12* (2006.01)
*H03M 1/68* (2006.01)
*G06N 3/04* (2006.01)
*H03M 1/46* (2006.01)
*H03M 1/10* (2006.01)

(52) U.S. Cl.
CPC ............... *H03M 1/68* (2013.01); *G06N 3/04* (2013.01); *H03M 1/1019* (2013.01); *H03M 1/462* (2013.01)

(58) Field of Classification Search
CPC ...... H03M 1/68; H03M 1/1019; H03M 1/462; H03M 1/12; G06N 3/04

USPC .......................................................... 341/155
See application file for complete search history.

(56) References Cited

U.S. PATENT DOCUMENTS

| | | | | |
|---|---|---|---|---|
| 5,165,010 A | * | 11/1992 | Masuda | G06N 3/063 706/42 |
| 5,343,198 A | * | 8/1994 | Collobert | H03M 1/361 341/138 |
| 5,455,583 A | | 10/1995 | Stryjewski | |
| 5,781,702 A | | 7/1998 | Alhalabi | |
| 5,875,439 A | * | 2/1999 | Engel | G06N 3/0445 706/41 |

(Continued)

FOREIGN PATENT DOCUMENTS

| CN | 102665049 B | 9/2014 |
|---|---|---|
| CN | 107622306 A | 1/2018 |

*Primary Examiner* — Jean B Jeanglaude
(74) *Attorney, Agent, or Firm* — Cantor Colburn LLP; Randall Bluestone

(57) ABSTRACT

A method for analog-to-digital conversion with reconfigurable function mapping for acceleration of calculating an activation function of a neural network system includes determining, by a shared circuit, a set of voltage intervals using digital bits in a look-up table to define a shape of the activation function being mapped. The shared circuit determines a set of most significant bits (MSBs) for each voltage interval by storing additional bits in the look-up table corresponding to each voltage interval entry. Further, each of several per-neuron circuits determines whether its accumulated input voltage is in a received voltage interval, and if so, causing the set of MSBs to be stored. Each of the per-neuron circuits determines a set of least significant bits (LSBs) by performing a linear interpolation over the voltage interval. The set of MSBs and the set of LSBs are output as a result of the activation function with analog-to-digital conversion.

14 Claims, 10 Drawing Sheets

(56) References Cited

U.S. PATENT DOCUMENTS

| | | | | |
|---|---|---|---|---|
| 6,262,678 | B1* | 7/2001 | Sarpeshkar | H03M 1/164 |
| | | | | 341/110 |
| 7,068,206 | B2* | 6/2006 | Augusto | H03M 1/125 |
| | | | | 341/120 |
| 9,489,618 | B2* | 11/2016 | Roy | G11C 11/16 |
| 9,813,048 | B2* | 11/2017 | Roy | G11C 15/046 |
| 10,476,487 | B2* | 11/2019 | Roy | G11C 11/1675 |
| 2006/0158365 | A1* | 7/2006 | Kernahan | H03M 1/38 |
| | | | | 341/155 |
| 2015/0347896 | A1* | 12/2015 | Roy | G06N 3/063 |
| | | | | 365/148 |
| 2017/0047913 | A1* | 2/2017 | Roy | G11C 11/54 |
| 2018/0069536 | A1* | 3/2018 | Roy | G11C 11/54 |
| 2018/0082174 | A1 | 3/2018 | Alvarez-Icaza Rivera | |
| 2019/0205729 | A1* | 7/2019 | Tran | G06N 3/0454 |

* cited by examiner

ANALOG-TO-DIGITAL CONVERSION WITH RECONFIGURABLE FUNCTION MAPPING FOR NEURAL NETWORKS ACTIVATION FUNCTION ACCELERATION

BACKGROUND

The present invention relates to efficient implementation of a computer technology and, more specifically, to accelerating computation of activation functions used by a neural network.

Artificial neural networks (ANNs), such as deep neural networks have had a revolutionary impact on the field of computing technology, particularly, artificial intelligence. ANNs have facilitated achieving improved performance as well as results on tasks such as image recognition, speech recognition, translation, image captioning, etc. This, in turn, has resulted in efforts directed towards the design of accelerators for both an inference phase and a training phase of an ANN. Among these, analog acceleration strategies using non-volatile memory (NVMs) have the potential to achieve orders of magnitude speedup and/or energy benefits over complementary metal-oxide-semiconductor (CMOS)-based approaches.

SUMMARY

According to one or more embodiments of the present invention, a method for analog-to-digital conversion with reconfigurable function mapping for acceleration of calculating an activation function of a neural network system is provided. The method includes determining, by a shared circuit, a set of voltage intervals, said voltage intervals saved as digital bits in a look-up table, and defining the overall shape of the arbitrary function being mapped. Further, the method includes determining, by the shared circuit, a set of most significant bits for each voltage interval by storing additional bits in the look-up table corresponding to each voltage interval entry. The method further includes sending, by the shared circuit, to each per-neuron circuit from multiple per-neuron circuits, the set of most significant bits and respective voltage intervals based on the look-up table. The method further includes determining, by each of the per-neuron circuits, whether corresponding accumulated input voltage is in a received voltage interval, and in response to the input voltage being in the received voltage interval, signaling a storage device, in each per-neuron circuit, to store the set of most significant bits. The method further includes determining, by each of the per-neuron circuits, a set of least significant bits by performing a linear interpolation over the received voltage interval. The method further includes outputting, by each of the per-neuron circuits, the set of most significant bits and the set of least significant bits as a result of the activation function with analog-to-digital conversion.

According to one or more embodiments of the present invention, a system includes a neural network system with multiple neuron circuits, each neuron circuit including a per-neuron circuit for mapping an activation function. The system further includes a shared circuit that is common to all of neuron circuits, the shared circuit coupled with the neuron circuits for performing a method for analog-to-digital conversion with reconfigurable function mapping for acceleration of calculating the activation function of a neural network system. The method includes determining, by the shared circuit, a set of voltage intervals, said voltage intervals saved as digital bits in a look-up table, and defining the overall shape of the arbitrary function being mapped. Further, the method includes determining, by the shared circuit, a set of most significant bits for each voltage interval by storing additional bits in the look-up table corresponding to each voltage interval entry. The method further includes sending, by the shared circuit, to each per-neuron circuit from multiple per-neuron circuits, the set of most significant bits and respective voltage intervals based on the look-up table. The method further includes determining, by each of the per-neuron circuits, whether corresponding accumulated input voltage is in a received voltage interval, and in response to the input voltage being in the received voltage interval, signaling a storage device, in each per-neuron circuit, to store the set of most significant bits. The method further includes determining, by each of the per-neuron circuits, a set of least significant bits by performing a linear interpolation over the received voltage interval. The method further includes outputting, by each of the per-neuron circuits, the set of most significant bits and the set of least significant bits as a result of the activation function with analog-to-digital conversion.

According to one or more embodiments of the present invention, a system includes several calculation circuits, and a shared circuit that is common to the calculation circuits. The shared circuit is coupled with the calculation circuits for performing a method for analog-to-digital conversion with reconfigurable function mapping for acceleration of calculating a function. The method includes determining, by the shared circuit, a set of voltage intervals, said voltage intervals saved as digital bits in a look-up table, and defining the overall shape of the arbitrary function being mapped. Further, the method includes determining, by the shared circuit, a set of most significant bits for each voltage interval by storing additional bits in the look-up table corresponding to each voltage interval entry. The method further includes sending, by the shared circuit, to each calculation circuit, the set of most significant bits and respective voltage intervals based on the look-up table. The method further includes determining, by each of the calculation circuits, whether corresponding accumulated input voltage is in a received voltage interval, and in response to the input voltage being in the received voltage interval, signaling a storage device, in each calculation circuit, to store the set of most significant bits. The method further includes determining, by each of the calculation circuits, a set of least significant bits by performing a linear interpolation over the received voltage interval. The method further includes outputting, by each of the calculation circuits, the set of most significant bits and the set of least significant bits as a result of the activation function with analog-to-digital conversion.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describe having a communications path between two elements and do not imply a direct connection between the elements with no intervening elements/connections between them. All of these variations are considered a part of the specification.

DETAILED DESCRIPTION

Embodiments of the present invention facilitate improvements to computing technology, and particularly neural networks, by providing technical features to implement a fast, flexible and area-efficient neuron that combines analog to digital conversion (ADC) together with arbitrary function mapping. In one or more embodiments of the present invention, technical solutions described herein are achieved by using a system that is split into a first part that includes common circuit components that are shared across all neurons in a neural network layer, and a second part that includes per-neuron area-efficient dedicated circuits.

Typically, non-volatile memory (NVM)-based accelerators use crossbar arrays of NVM devices, with conductances (or resistances) at the crosspoints encoding the weights of the neural network. In these crossbar arrays, multiply-accumulate operations, which account for a significant portion of a neural network's compute workload, can be implemented extremely efficiently. Using a combination of Ohm's law (I=GV) for multiplication and Kirchhoff's current law for summation, the compute operation may be done at the location of the data in a massively parallel fashion. This is an example of a non-Von Neumann architecture, where the elimination of significant amounts of off-chip data movement may enable orders of magnitude system-level improvements.

Figure 1:
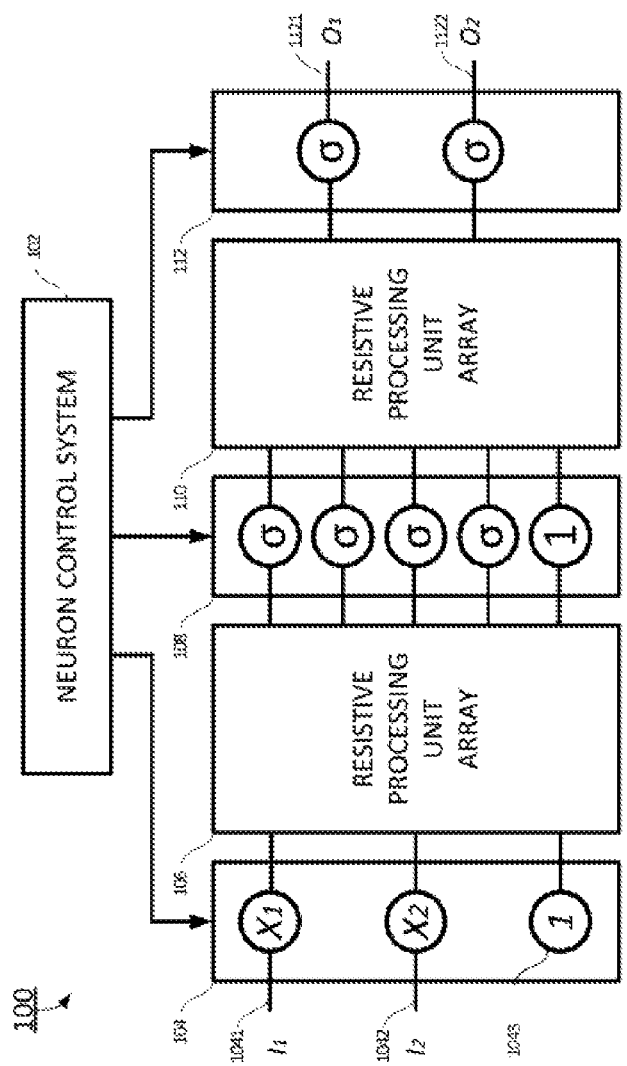
FIG. 1 shows a schematic illustration of a neural network system in accordance with one or more embodiments of the present invention.

FIG. 1 depicts a block diagram of an example neural network system according to one or more embodiments of the present invention. Embodiments of the present invention include neural network hardware having one or more arrays of resistive processing units (RPUs) as shown in FIG. 1. An RPU is one possible example of a NVM-based device used at a crosspoint in the depicted crossbar arrays, and it is understood that in other embodiments of the present invention, different types of NVM-based devices may be used. In one embodiment, the neural network system 100 may include a set of input neurons 104, one or more sets of hidden neurons 108, one or more arrays of resistive processing units 106 and 110, a set of output neurons 112 and a neuron control system 102. In one embodiment as shown in FIG. 1 for simplicity, the input neurons 104 may include a unit neuron 1043, a first input neuron 1041 electrically coupled to a first input signal I1, and a second input neuron 1042 electrically coupled to a second input signal I2. In other embodiments of the present invention, the input neurons 104 may include many more neurons 104N, where N is a positive integer. The output neurons 112 may include a first output neuron 1121 electrically coupled to a first output signal O1, and a second output neuron 1122 electrically coupled to a second output signal O2. Similar to the input neurons 104, the output neurons 112 may include many more neurons 112M, where M is a positive integer. In certain embodiments of the present invention, the N may be the same as M. In other embodiments of the present invention, the N may be different from M.

In certain embodiments of the present invention, the hidden neurons 108 may include one layer of hidden neurons as shown in FIG. 1. In other embodiments of the present invention, the hidden neurons 108 may include several layers of hidden neurons 108. As shown in FIG. 1, the array of resistive processing units 106 is interconnected with the input neurons 104 and the hidden neurons 108. The array of resistive processing units 110 is interconnected with the hidden neurons 108 and the output neurons 112. In other embodiments of the present invention, the neural network system 100 may include more than one layer of hidden neurons, and the resistive processing unit arrays 106, 110 and more may be interconnected to the input neurons, one or more layers of hidden neurons and the output neurons 112 in similar manner as shown in FIG. 1.

In certain embodiments of the present invention, each of the input neurons, the hidden neurons, and the output neurons may include: (i) a feed forward chain configured to apply a computation based on an input data point from an input of the neuron, and to produce a result of the computation as an output data point at an output of the neuron, (ii) a back propagation chain configured to apply a computation based on an error data point and a derivative of the computation of the feed forward chain from an input and to produce an error data point at an output, and (iii) one or more weight update generators configured to produce a weight update data point in accordance with a local error value ("weight").

In certain embodiments of the present invention, each of the input neurons, the hidden neurons, and the output neurons is associated with a data point, and the associated data point is currently processed by the neuron. Each data point may include an input current from the input, and an output voltage pulse at the output. In certain embodiments of the present invention, the input current is compared to a reference current to determine a sign and magnitude of an input to the computation.

In certain embodiments of the present invention, one or more of the input neurons and hidden neurons is a constant neuron configured to provide a constant voltage output during feed forward operation.

Figure 2:
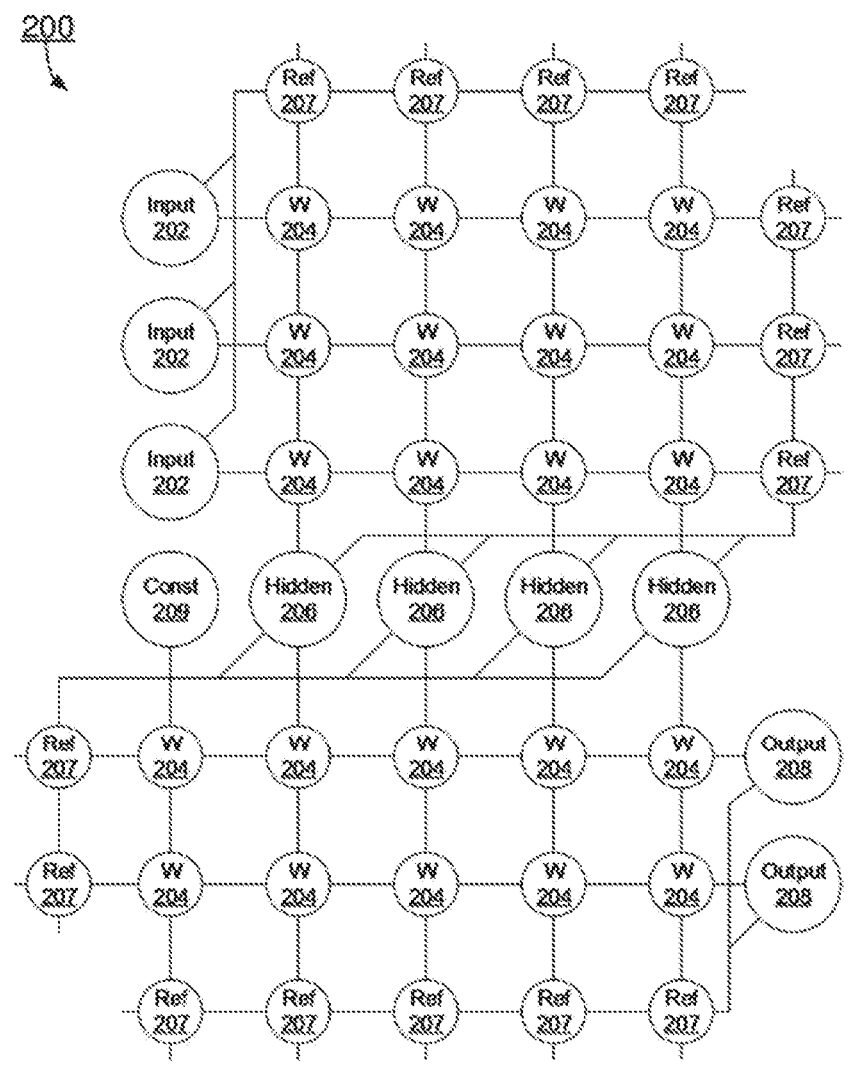
FIG. 2 is a block diagram representing an example layer of neurons according to an embodiment of the present invention.

Referring now to FIG. 2, a neural network hardware architecture 200 is shown according to certain embodiments. During feed-forward operation, each of a set of input neurons 202 sends a corresponding input voltage in parallel to a respective row of weights 204. Each of the weights 204 has a settable resistance value, such that a current output flows from the weight 204 to a respective hidden neuron 206 to represent the weighted input. The current output by a given weight is determined as 1=V/r, where V is the input voltage from the input neuron 202 and r is the set resistance of the weight 204. The current from each weight adds column-wise and flows to a hidden neuron 206. Reference weights 207 have a fixed resistance and combine their outputs into a reference current that is provided to each of the hidden neurons 206. Because conductance values can only be positive numbers, some reference conductance is needed to encode both positive and negative values in the matrix. The currents produced by the weights 204 are continuously valued and positive, and therefore the reference weights 207 are used to provide a reference current, above which currents are considered to have positive values and below which currents are considered to have negative values. In certain embodiments of the present invention, each array of weights may include one or more reference weights having a static resistance.

As an alternative to using the reference weights 207, another embodiment may use separate arrays of weights 204 to capture negative values. Each approach has advantages and disadvantages. In certain embodiments of the present invention, using the reference weights 207 is more efficient in chip area, but reference values need to be matched closely to one another. In other embodiments of the present invention, the use of a separate array for negative values does not involve close matching as each value has a pair of weights to compare against. However, the negative weight matrix approach uses roughly twice the chip area as compared to the single reference weight column. In addition, the reference weight column generates a current that needs to be copied to each neuron for comparison, whereas a negative matrix array provides a reference value directly for each neuron. In the negative array embodiment, the weights 204 of both positive and negative arrays are updated, but this also increases signal-to-noise ratio as each weight value is a difference of two conductance values. The two embodiments provide identical functionality in encoding a negative value and those having ordinary skill in the art will be able to choose a suitable embodiment for the application at hand.

The hidden neurons 206 use the currents from the array of weights 204 and the reference weights 207 to perform some calculation. The hidden neurons 206 then output a voltage of their own to another array of weights 207. This array performs in the same way, with a column of weights 204 receiving a voltage from their respective hidden neuron 206 to produce a weighted current output that adds row-wise and is provided to the output neuron 208.

It should be understood that any number of these stages may be implemented, by interposing additional layers of arrays and hidden neurons 206. It should also be noted that some neurons may be constant neurons 209, which provide a constant voltage to the array. The constant neurons 209 can be present among the input neurons 202 and/or hidden neurons 206 and are only used during feed-forward operation.

In certain embodiments of the present invention, during back propagation, the output neurons 208 provide a voltage back across the array of weights 204. The output layer compares the generated network response to training data and computes an error. The error is applied to the array as a voltage pulse, where the height and/or duration of the pulse is modulated proportional to the error value. In this example, a row of weights 204 receives a voltage from a respective output neuron 208 in parallel and converts that voltage into a current which adds column-wise to provide an input to hidden neurons 206. The hidden neurons 206 provide the weighted feedback signal with a derivative of its feed-forward calculation and store an error value before outputting a feedback signal voltage to its respective column of weights 204. This back propagation travels through the entire network 200 until all hidden neurons 206 and the input neurons 202 have stored an error value.

In certain embodiments of the present invention, during weight updates, the input neurons 202 and hidden neurons 206 apply a first weight update, and the output neurons 208 and hidden neurons 206 apply a second weight update through the network 200. The combinations of these voltages create a state change within each weight 204, causing the weights 204 to take on a new resistance value. In this manner, the weights 204 can be trained to adapt the neural network 200 to errors in its processing. It should be noted that the three modes of operation, feed forward, back propagation, and weight update, do not overlap with one another.

Figure 3:
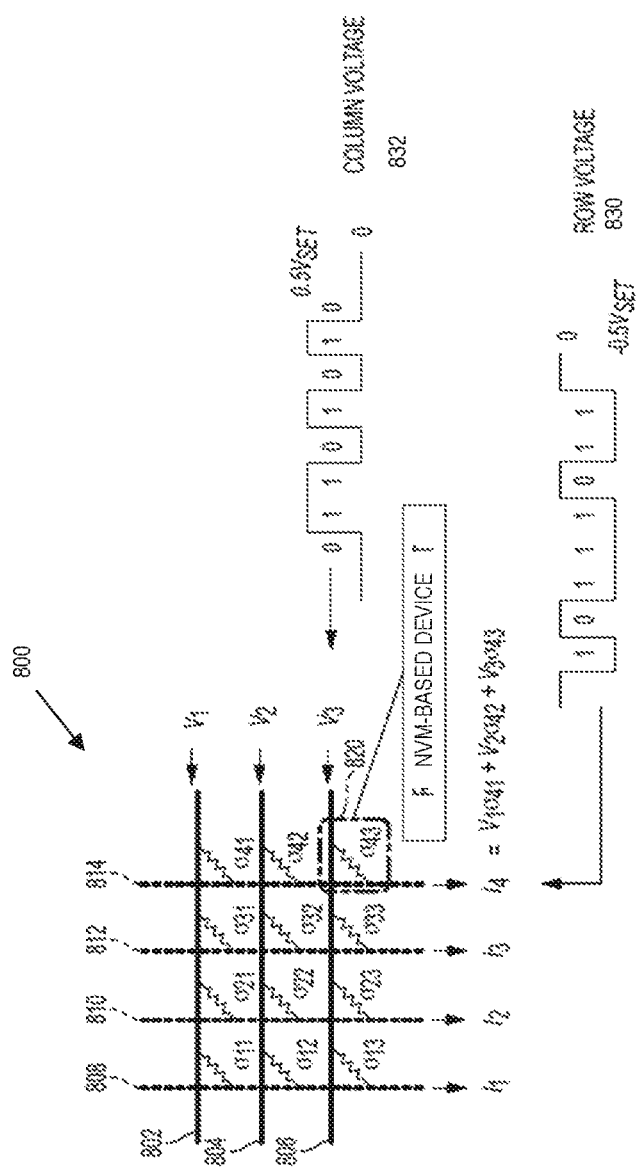
FIG. 3 is a block diagram representing a crossbar array in accordance with one or more example embodiments of the present invention.

FIG. 3 depicts an example crossbar array that can be used in one or more embodiments of the present invention. The crossbar array 300 includes an NVM-based device 320 at each cross-point. The NVM-based device 320 can be an RPU, or any other type of synaptic devices that facilitates the operation of the neuromorphic device. FIG. 3 is a diagram of a two-dimensional (2D) crossbar array 300 that performs forward matrix multiplication, backward matrix multiplication, and weight updates according to embodiments of the present invention. It should be noted that in one or more embodiments of the present invention a chip can include one or more separate cross-bar arrays, each for performing such operations for separate layers of the ANN being implemented, each cross-bar array 300 corresponding to a respective layer. It is understood that the cross-bar array 300 is just one example and that different types of cross-bar arrays can be used in other examples without limiting the features provided by one or more embodiments of the present invention. Further, it is understood that in one or more embodiments of the present invention, neural net layers and crossbar array layers are not in 1:1 correspondence. Multiple crossbars may be needed for a single neural network layer, or in some cases, multiple neural network layers are implemented on the same crossbar array.

Figure 6:
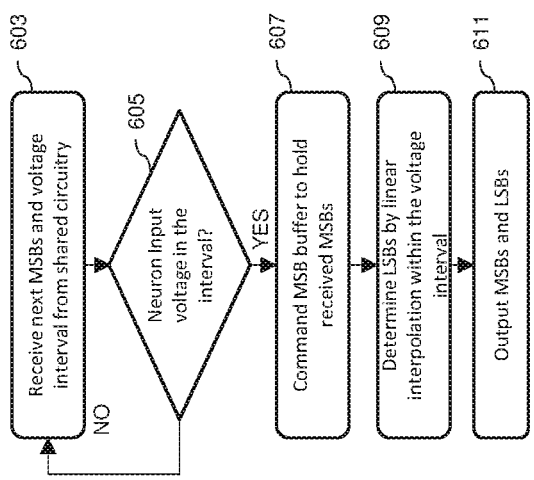
FIG. 6 is a process flow diagram of an illustrative method for analog-to-digital conversion with reconfigurable function mapping for neural networks activation function acceleration in accordance with one or more example embodiments of the present invention.
Figure 6:
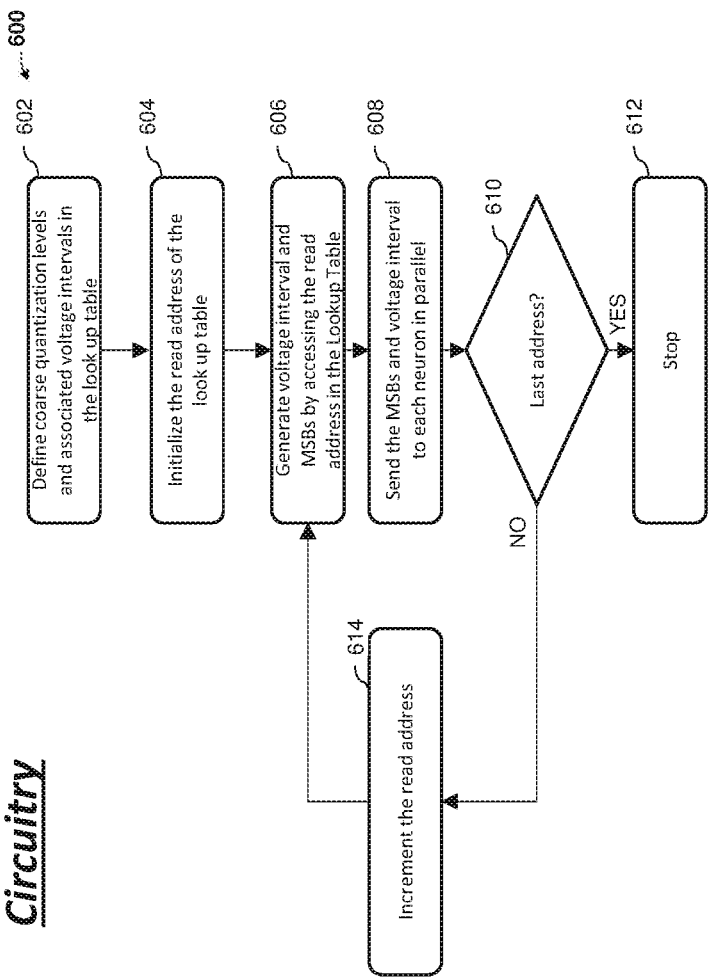

The crossbar array 300 is formed from a set of conductive row wires 302, 304, 306 and a set of conductive column wires 303, 310, 312, and 314 that intersect the set of conductive row wires 302, 304, and 306. The intersections between the set of row wires and the set of column wires are separated by neuromorphic devices, which are shown in FIG. 6 as resistive elements each having its own adjustable/updateable resistive weight, depicted as σ11, σ21, σ31, σ41, σ12, σ22, σ32, σ42, σ13, σ23, σ33 and σ43, respectively. For ease of illustration, only one neuromorphic device 320 is labeled with a reference number in FIG. 3. In forward matrix multiplication, the conductance state (i.e., the stored weights) of the neuromorphic device can be read by applying a voltage across the neuromorphic device and measuring the current that passes through the neuromorphic device.

Input voltages V1, V2, V3 are applied to row wires 302, 304, 306, respectively. Each column wire 308, 310, 312, 314 sums the currents I1, I2, I3, I4 generated by each neuromorphic device along the particular column wire. For example, the current I4 generated by column wire 314 is according to the equation I4=V1/σ41+V2/σ42+V3/σ43. Thus, the crossbar array 300 computes the forward matrix multiplication by multiplying the values stored in the neuromorphic devices by the row wire inputs, which are defined by voltages V1, V2, V3. The backward matrix multiplication is very similar. In backward matrix multiplication, voltages are applied at column wires 308, 310, 312, 314 and then read from row wires 302, 304, 306. For weight updates, which are described in greater detail below, voltages are applied to column wires and row wires at the same time, and the conductance values stored in the relevant cross-point synaptic devices all update in parallel. Accordingly, the multiplication and addition operations required to perform weight updates are performed locally at each neuromorphic device 320 of crossbar array 300, by using the cross-point synaptic device itself plus the relevant row or column wire of crossbar array 300. Thus, in accordance with the one or more embodiments of the present invention, no read-update-write cycles are required in crossbar array 300.

In accordance with one or more embodiments, the operation of a positive weight update methodology for neuromorphic device 320 and its corresponding weight σ33 at the intersection of conductive row wire 306 and conductive column wire 312 will now be provided. Update generator circuitry (not shown) is provided at the periphery of the crossbar array 300 and used as a peripheral "translator" in order to generate necessary voltage pulses in the form of stochastic bit streams that are applied to all neuromorphic devices of the 2D crossbar array 300.

Accordingly, referring to the ANN implemented using a cross-point array including RPUs as described herein, in the array, the value of the resistance (or conductance) of each node determines the coupling between nodes, where a node is represented by an cross-point synaptic device in the crossbar array 300. Further, upon training the crossbar array 300 according to the ANN, the resistance (or conductance) will be different from each neuromorphic device to neuromorphic device, depending on the desired coupling. For training a neural network, it is necessary to actively adjust the resistance (conductance) values. Once the training is complete, the resistance values remain fixed during operation of the cross-point array circuit, until training begins for a new task.

Accordingly, an artificial neural network implemented using the neural network system 100 uses an activation function to generate a neuron output based on the weighted sum of input neuron activations. This can be represented as $y_j=f(\Sigma x_i w_{ij})$, where $y_j$ is the output neuron activation, $x_i$s are the input activations from previous layer neurons, and $w_{ij}$ are the weights. The activation function 'f' is typically non-linear and may include functions such as Rectified Linear Units (ReLU), tan h, sigmoid, etc. or their derivatives. In digital or analog accelerators, specialized hardware is needed to map such functions. Typically the activation function is computed using an analog system or a digital system.

In the analog system, an analog quantity representing the sum is accumulated on a capacitor, and a time-duration pulse is generated based on comparing this value against a ramp or a shaped function. This approach is fast, but it is technically challenging to design analog circuits with complete flexibility with respect to the function to be mapped.

In the digital system, the analog input is converted to a digital representation using an Analog-to-Digital Converter (ADC). The signal is then processed to map the function in the digital domain. This is a two-step process—first implementing a conversion, followed by function mapping. Moreover, the ADC has to convert values across the entire input range, thus requiring a large number of bits to be accurate. This results in a large circuit block which may need to be time-multiplexed across some number of neurons, limiting the number of analog-to-digital conversions that can be implemented in parallel, thus increasing the total time to evaluate all the neuron activations.

The technical solutions provided by one or more embodiments of the present invention address such technical challenges by providing high throughput and low latency and achieving the same degree of parallelism in the peripheral circuits as that achievable with the crossbar array. For this, one or more embodiments of the present invention provide area-efficient circuits. In one or more embodiments of the present invention, the technical solutions provide a fast, flexible and area-efficient neuron implementation that combines analog to digital conversion together with arbitrary function mapping. The activation function computation is split into common circuit components that are shared across all neurons in the laye, and per-neuron area-efficient dedicated circuits.

In one or more embodiments of the present invention, as will be described in detail further, the 'common' circuit component is responsible for determining the most significant bits (MSB) of the output neuron activations. The common circuit includes a look-up table (LUT) with digital entries connected to a Digital to Analog Converter (DAC). The entries within the LUT step through a coarse representation of the arbitrary function being mapped, and the DAC generates corresponding analog voltage values that are compared in parallel against the accumulated neuron voltages. When a neuron voltage is determined to fall between successive DAC voltage values, its 'voltage interval' as well as a set of bits corresponding to that particular voltage interval are determined. These bits represent the MSBs of the output neuron activation.

Further, in one or more embodiments of the present invention, as will be described in detail further, per-neuron dedicated circuits are responsible for determining the least significant bits (LSBs) of the output neuron activations. This circuitry includes an ADC, which can operate asynchronously with respect to the LUT. The ADC can be lower in precision than those used in existing solutions, the lower precision facilitating area-efficiency, as well as faster computation. The ADC linearly interpolates within the voltage interval. The per-neuron circuit also includes circuitry to locally store the voltages coming from the shared DAC. Accordingly, the ADC can operate while the LUT entries are changing. This allows highly parallelized operation and ensures that the total time to generate activations never exceeds the time taken to step through the LUT entries plus the time to do the final ADC interpolation.

As a result, the conversion maps the input to the given function with a Total Number of Bits (TNBs) equal to the sum of the number of MSBs and LSBs. Accordingly, embodiments of the present invention provide a fully programmable neuron voltage activation function mapping. Further, embodiments of the present invention facilitate analog to digital conversion and function mapping in a single step. Also, the advantages of embodiments of the present invention include a small per-neuron required area with a limited amount of serial operations that impact the final conversion time. Accordingly, embodiments of the present invention facilitate flexibility in the final conversion precision by changing the effective memory used.

Embodiments of the present invention, accordingly, provide improvements over a full-analog approach activation function computing that provides a fast and small solution to map the activation function but is not very flexible. Instead, embodiments of the present invention allow a user to freely define the shape of the function to be mapped in the digital domain. Additionally, this can be done without the need of modifying the hardware, as it only requires changing the values stored in the memory.

Also, embodiments of the present invention provide improvements over a full-digital approach of activation function computing that is based on converting the neuron voltage from analog to digital in the entire range of interest, thus requiring more bits of resolution in the ADC. Typically, the converted function can then be mapped in the digital domain by using specific algorithms using logic circuits or microprocessors. Due to the increased number of bits, the used ADCs are larger and slower with respect to the ones used in one or more embodiments of the present invention. While a fully flexible LUT can then map the digital bits to any arbitrary function, the size of the number of entries in the LUT grows exponentially with the number of bits in the existing fully digital approaches.

Additionally, when mapping a non-linear function on to a digital signal, a quantization error propagates as the derivative of the interval. For instance, in typical ADCs the input analog voltage is discretized across equal intervals. This causes under-sampling in the regions where the function to be mapped has a larger slope, and over-sampling in regions where the function to be mapped has a shallower slope. Depending on the architecture of the neural network system used, this undersampling effect could have a large impact on the time and/or the area of the circuit. For instance, when considering a Successive Approximation (SAR) ADC, the area grows exponentially with the number of bits, thus making the conversion block even bigger in proportion to the entire circuit.

Instead, embodiments of the present invention allow a single-step conversion and function mapping, eliminating the need for specific hardware to perform the mapping. Moreover, the same number of output bits can be reached with smaller ADCs, thus reducing the per-neuron circuit area, and increasing the number of ADCs that can work in parallel in a limited amount of space.

Figure 4:
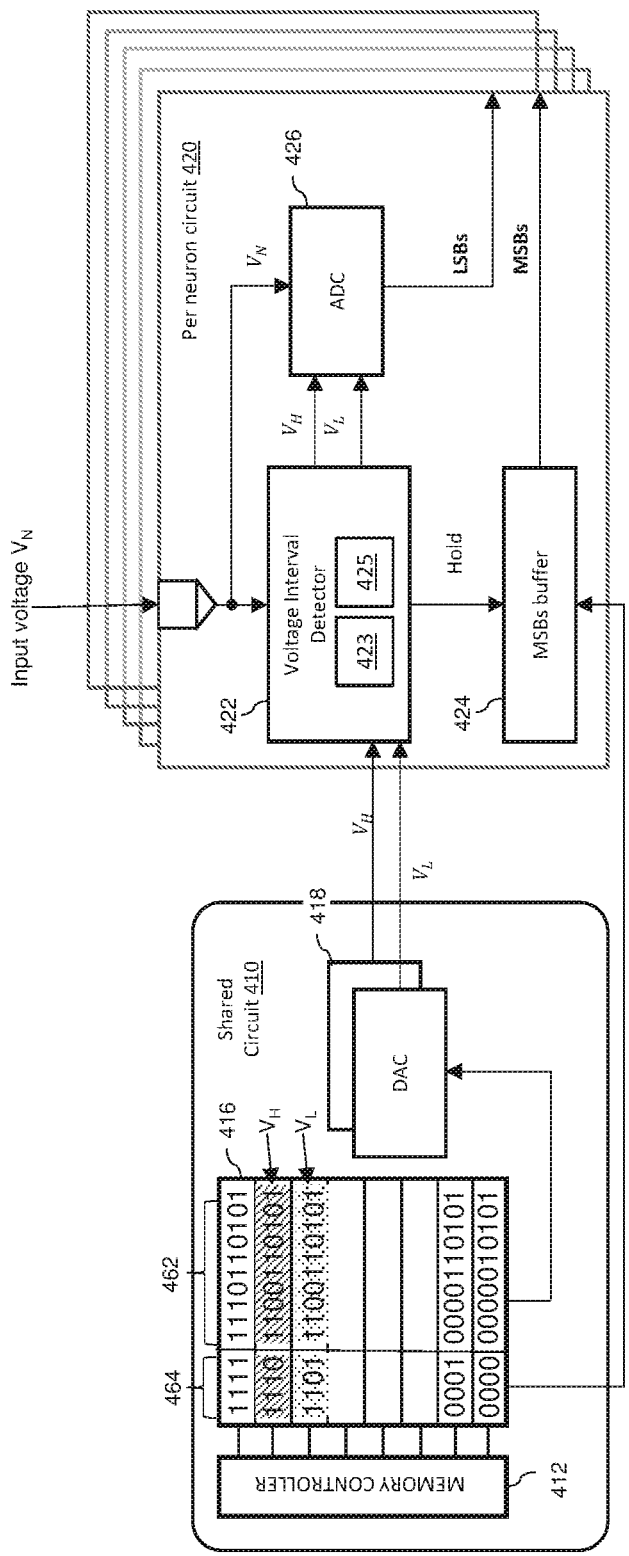
FIG. 4 depicts a block diagram of an example activation function computation system according to one or more embodiments of the present invention.

FIG. 4 depicts a block diagram of an activation function computing system according to one or more embodiments of the present invention. The activation function computing system 400 includes a shared circuit 410 and multiple per-neuron circuits 420. The shared circuit 410 is common to one or more neurons, for example, all the neurons implemented using a crossbar array 300. As described herein, each column in the crossbar array 300 may be associated with one neuron in one or more embodiments of the present invention. In one or more embodiments of the present invention, two or more columns can correspond to a single neuron. Alternatively, or in addition, the shared circuit 410 can be associated with a particular set of neurons. Each per-neuron circuit 420 is associated with a particular neuron, and accordingly, the system 400 includes as many per-neuron circuits 420 as neurons that can be operated in parallel.

The shared circuit 410 includes, among other components, a controller 412, a look-up table (LUT) 416, and one or more digital-to-analog converters (DACs) 418. The controller 412 is a processing unit that can control the operations of the shared circuit 412, such as searching through the LUT 416 for MSBs, and sending the MSBs to the per-neuron circuits 412. The LUT 416 is a set of registers or a memory device that can store the reference voltage intervals to define the activation function 510. The LUT 416 also stores MSBs for each voltage interval. Each DAC 418 can be a 10-bit capacitive DAC, with the higher number of bits allowing more precision in defining the interval boundaries. Other types of DACs can also be used, for example 4-bit, 8-bit etc. In one or more embodiments of the present invention, operational amplifiers (not shown) are configured as voltage followers to drive the output of the DACs 418 to all the per-neuron circuits 420 in the array 300.

The per-neuron circuit 420 includes, among other components, a voltage interval detector 422, a MSB buffer 424, and an ADC 426. The voltage interval detector 422, in one or more embodiments of the present invention, includes a comparator 423 implemented as a cascaded differential pair for high gain. It should be noted that the comparator can be implemented using other techniques, such as inverter-based amplifier etc. The voltage interval detector 422 can include capacitors 425 that are used to store input voltage $V_N$ and interval references ($V_L$ and $V_H$) in which linear interpolation is to be performed. The MSB buffer 424 is a register or any other storage element. The ADC 426 is a successive approximation ADC.

The system 400 performs a function mapping during conversion from analog voltage to the digital domain. Consider for example a non-linear function 510 shown in plot 500 of FIG. 5. The x-axis corresponds to the analog input voltage level ($V_N$), and the horizontal dashed lines represent equally spaced quantization levels 515, each of which has a corresponding digital representation. The points 520 at the interception of the dashed lines with the function 510 trace out an approximate representation of the function 510. In this formalism, a voltage interval 525 can be defined as the region between x-intercepts of two adjacent quantization levels 515 (e.g., between $V_L$ and $V_H$ in FIG. 5). All analog voltages within this interval 525 share the same MSBs 530, e.g., 1110, corresponding to the quantization level 515 of $V_L$.

Figure 5:
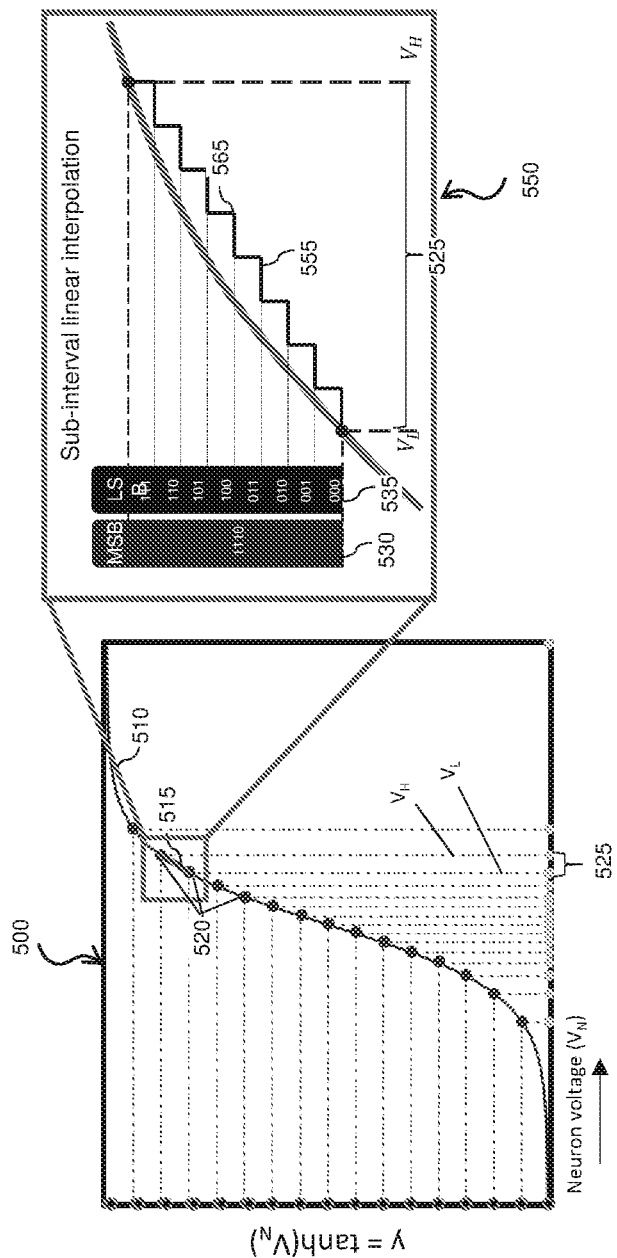
FIG. 5 depicts an example activation function and corresponding methods to quantize that activation function according to one or more embodiments of the present invention.

Further, the system 400 performs a linear interpolation within the interval 525 to determine additional bits of precision, which correspond to the LSBs 535. In FIG. 5, a zoomed-in view 550 of the interval 525, $V_L$ to $V_H$, is shown. The staircase structure 555 within the interval 525 represents the LSB quantization levels 565 obtained from linear interpolation. Note that while these LSB levels are equally spaced, the intervals themselves may not be equally spaced given the non-linear nature of the activation functions in one or more embodiments of the present invention.

FIG. 6 depicts a flowchart of a method implemented by the activation function computation system 400 to compute the activation function according to one or more embodiments of the present invention. The method 600 includes defining coarse quantization levels 515 and associated voltage intervals 525, at block 602. The number of quantization levels 515 is set to be large enough to define the overall shape of the activation function 510, yet small enough that the total time to traverse through all the quantization levels 515 does not exceed a predetermined threshold. The definition is a configuration that is performed once, prior to the neural network system 100 being operated. For instance, using 16 quantization levels 515 in this step would require a selection from 1-of-16 voltage intervals 525. Accordingly, the input voltage range [0, $V_{N\text{-}max}$] is divided into 16 intervals 525 in this case. It is understood that the number of intervals can be different in other embodiments of the present invention and can be dependent on the activation function 510 that is being used. If the function is non-linear, voltage intervals 525 are of unequal length in one or more embodiments of the present invention. The configuration can be setup using the controller 412. It should be noted that equal length intervals on the x-axis are possible, although not typical. Equal length 525 intervals are observed if the activation function being mapped is linear. The non-linear function mapping necessitates that if the y-axis is equally spaced, per FIG. 8, the x-axis intervals be unequally spaced.

Because the quantization levels 515 are equally spaced on the y-axis, by definition, the voltage intervals not only specify a particular interval in the LUT 416, but could also be associated with X-bit values corresponding to the MSBs of the converted digital quantity corresponding to voltage interval 525. For example, in the case of a monotonic activation function 510 such as tan h, the MSBs can go from 0000 to 1111 (here, X=4), as shown in FIG. 5. Additional LSB bits of precision for each neuron can be implemented using linear interpolation within each interval 525, as shown in the zoomed-in view 550.

The method 600 further includes sequentially generating multiple voltage intervals 525 of interest and the corresponding MSBs by traversing the entries of the look up table, at block 606. At each time step, a read address is received by the controller 412. The LUT 416 contains digital values 462 corresponding to the analog voltage x-intercepts 525. A digital value 462 from the LUT 416 is read out corresponding to the read address at each time step. Further, the corresponding analog voltage references ($V_L$ and $V_H$) for the input voltage $V_N$ are generated by the DACs 418, at block 606. These are the bounding voltages of any one voltage interval 525. The bounding values are determined based on the initial setup intervals. In the case of monotonic functions such as tan h, every single voltage interval is uniquely defined by the MSBs. Thus, these MSBs can be directly obtained from the read address used to reference the shared LUT 416, as can be seen in FIG. 4. In one or more embodiments of the present invention, in the case of a monotonic activation function, the set of MSBs corresponding to each voltage interval is determined by a counter that steps through the addresses of the LUT 416.

In one or more embodiments of the present invention, multiple voltage intervals can be output from the shared circuit 410 (using for instance a wider LUT and more DACs) to multiple voltage detectors 422 in each neuron. In this way, the time for searching through the LUT 416 by the shared circuit 410 can be ameliorated. This requires increasing the number of voltage detectors in the per-neuron circuitry, along with logic circuits to process the different inputs—however, the tradeoff can be worthwhile if the area and power of the per-neuron circuits are dominated by the ADC (of which there will still be only one per neuron) and not the voltage detectors.

The LUT 416 also contains the multi-bit MSB bits 464 for each interval 525. These MSB bits 464 are sent to all the per-neuron circuits 420 in the neurons associated with the shared circuit 410 at each time-step, at block 608. When the analog voltage stored on a neuron is determined to fall within a particular interval, the per-neuron voltage interval detector 422 fires and sends a 'hold' notification to the MSBs buffer 424, at blocks 610 and 612. This is performed by each per-neuron circuit 420 in the set of neurons, and is performed substantially concurrently. If the MSBs buffer 424 receives the signal to hold, the MSBs coming from the LUT 416 are latched into the MSB buffer 424 of that neuron for storage. The MSBs buffer 424 can be a memory register in one or more embodiments of the present invention that is at least as wide as the MSBs, for example, 4-bit, 8-bit etc. Alternatively, if the input voltage $V_N$ is not in the voltage interval 525, the voltage interval detector 422 does not generate the hold signal, and the MSBs are not stored in the MSBs buffer 424. In one or more embodiments of the present invention, some per-neuron circuits 424 can be operating in the case where the hold signal is generated, and some in the case where the hold signal is not generated. Other combinations are also possible, such as none of the per-neuron circuits 420 generate the hold signal, or all of the per-neuron circuits 420 generate the hold signal.

In one or more embodiments of the present invention, the neuron reference intervals in the LUT 416 are searched in descending order from the highest x-axis voltage to the lowest. In this way each neuron can recognize the corresponding interval as the first one in which its value $V_N$ is higher than the lower reference $V_L$. As soon as $V_N$ is higher than $V_L$, the comparator 423 issues the hold signal causing the neuron voltage and the references to be stored in capacitors 425. In these embodiments, it may not be necessary to propagate the higher reference $V_H$ at each time step, although each neuron circuit would need to have preserved the previous voltage reference for linear interpolation.

In one or more embodiments of the present invention, the per-neuron circuits 420 are decoupled from the shared circuit 410 at this stage. For example, once the capacitors 425 are charged, the hold signal is switched off. With the neuron disconnected from the reference lines, the LSB conversion can proceed, asynchronously and independently from other voltage interval comparisons on other neurons. The signals are then fed into the ADC 426 using a common source stage. The speed of the shared circuit 410 is determined by a total load capacitance to charge, which is directly linked to the number of neurons connected to the shared circuit 410 at a given time. By charging a neuron capacitor only when the "correct interval" for such neuron is found, one or more embodiments of the present invention facilitate limiting the load capacitance at a given time, leading to a faster clocking. Moreover, when used in a DNN application, where the shape of neuron voltage distribution, i.e., the typical population of neurons whose voltages fall within each voltage interval, is known apriori, it is possible to adjust the time spent at each entry in the LUT based on this distribution; that is, a voltage interval expected to be "correct" for more neurons will have a longer delay with respect to another one, in which less neurons are expected to turn on. Here, the distribution refers to populations, for example, a probability density function, that indicates a number of neurons expected to be within a particular voltage interval.

The per-neuron circuit 420 performs a linear interpolation within the voltage interval 525 to determine the LSBs locally using the linear ADC 426, at block 609. This step is performed only on those per-neuron circuits 420 when the hold signal is generated, and the corresponding MSBs are output. In contrast to the digital approach, the ADC 426 uses fewer bits, significantly decreasing the per-neuron circuit area and making it feasible to allocate a dedicated low-precision ADC 426 for each neuron. The ADC 426, moreover, can work asynchronously with the LUT 416 that provides the boundary reference voltages, by saving them before starting the conversion. As a result, the output LSB conversion may be parallelized, and the total conversion time is almost entirely determined by the time required to serially scan through all the entries of the LUT 416. Moreover, the area of the DACs 418 and LUT 416 is amortized among all the neurons in a layer, limiting its contribution to the total circuit area.

It should be noted that the per-neuron ADC 426 does not implement the non-linear function; rather, the ADC 426 carries out a linear interpolation within any the voltage interval 525 using successive approximation (SAR) or any other technique. For example, the ADC 424 always works in a fixed voltage range and the input voltage $V_N$ is scaled to that voltage range before inputting to the per-neuron circuit 420. In one or more embodiments of the present invention, the analog input voltage is rescaled to within a pre-defined fixed voltage range for subsequent analog to digital conversion by the ADC 426. In one or more embodiments of the present invention, the rescaling factor(s) are determined based on the voltage interval in which said analog input voltage lies. Further, in one or more embodiments of the present invention, the rescaling factor(s) for each interval are stored in the LUT 416. Rescaling the input voltage can include using a voltage controlled current source, whose control voltage is determined by the rescaling factor. Further, the rescaling can include charging a capacitor for a specified period of time, the duration determined by the rescaling factor.

The non-linear function is instead inferred from the entries in the shared LUT 416, which define the voltage intervals 525 over which each neuron voltage $V_N$ is compared and to determine the MSB values. The non-linear function may be changed by changing the data in the LUT 416. The LUT 416 may be populated using standard digital IO interfaces where bandwidth requirements are not stringent, as the activation function 510 is defined before the neural network task commences, and typically stays unchanged through training or inference.

The MSBs and the LSBs from the per-neuron circuits 420 are then output to the next layer, or next step in the neural network system 100, at block 616. In one or more embodiments of the present invention, after the capture of the MSB bits and the linear interpolation of the LSBs, standard pooling or batch normalization operations can be carried out. The MSBs and LSBs together provide the result of the activation function 510 that can be then used by the neurons for further tasks as part of the neural network system 100. For example, the result can be used for forward propagation, backward propagation, weight update, etc.

The split in number of MSBs and the number of LSBs between the external LUT 416 and the per-neuron ADCs 426 can be different in different embodiments of the present invention. A larger number of MSB bits allows for higher precision in capturing the non-linear curve of the activation function 510, but also implies an increase in the number of entries in the LUT 416. Additionally, a larger number of MSB bits leads to an exponential increase in the time required to traverse the LUT 416 and check against all possible voltage intervals (which can impact neural network performance). An optimal split can be determined and preconfigured (e.g., 3-bits, 4-bits, 8-bits etc.) during the setup phase when the voltage intervals 525 are defined by the user. The examples described herein consider 4 bits shared LUT 416, and 4 bits per-neuron ADCs 426, however, as noted earlier, different embodiments can use different lengths of MSBs and/or LSBs.

Figure 7:
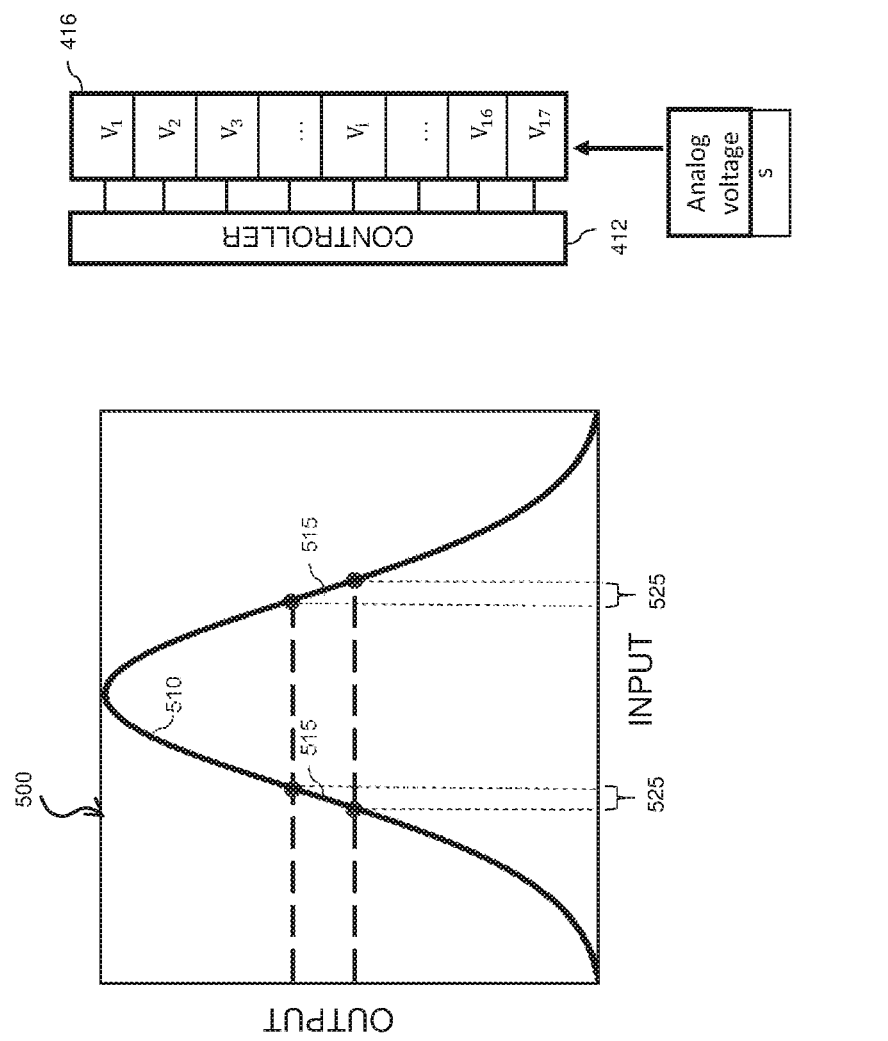
FIG. 7 depicts an example of a non-monotonic activation function where a single y-value may have multiple corresponding x-values, according to one or more embodiments of the present invention.

As noted earlier, in the case of monotonic functions such as tan h, every single voltage interval is uniquely defined by the MSBs. Thus, these MSBs can be directly obtained from the address used to reference the shared LUT 416, as can be seen in FIG. 4. However, when considering non-monotonic activation functions such as $sech^2$ function (the derivative of tan h), which can be used during the backpropagation step, any given output interval could correspond to one or more input intervals, as shown by 515 in FIG. 7. Accordingly, in one or more embodiments of the present invention, the corresponding MSBs are explicitly specified for each entry, as shown in FIG. 8.

Figure 8:
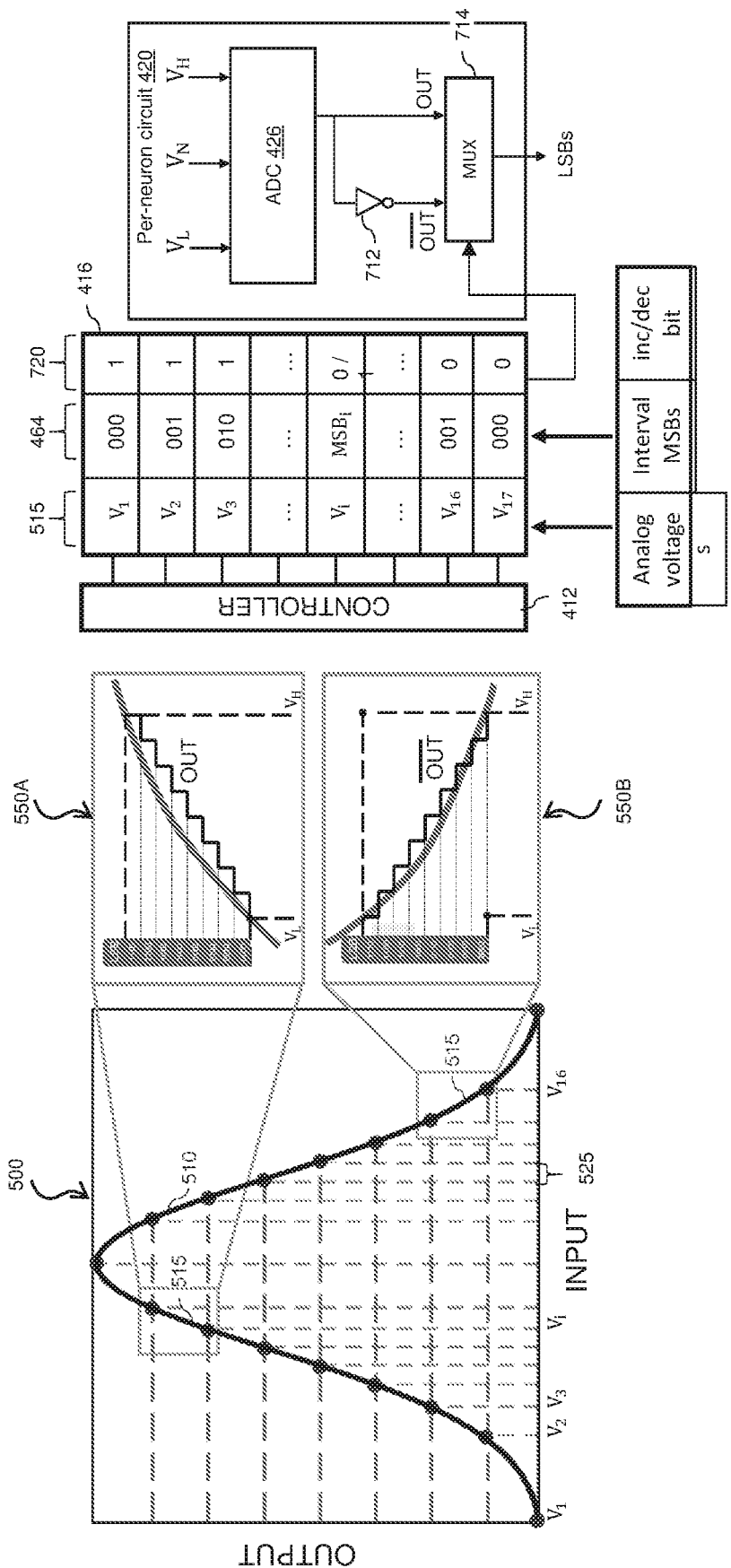
FIG. 8 depicts a partial block diagram of an example activation function computation system that can facilitate analog-to-digital conversion with reconfigurable function mapping for neural networks activation function acceleration in the case of monotonic and non-monotonic functions according to one or more embodiments of the present invention.

As depicted in FIG. 8, the LUT 416 still includes entries for each voltage intercept 515, and each entry includes the MSBs 464 corresponding to the voltage interval 525. In addition, each entry includes a slope-identifier bit 720 that indicates whether the intercept 515 is from the ascending slope or the descending slope of the activation function 510. As shown by the zoomed-in views 550A and 550B for the ascending slope and the descending slope respectively, in FIG. 8, the result of the linear interpolation results in different LSBs for the two distinct voltage intervals 525 corresponding to the intercepts 515. The per-neuron circuits 420 use standard digital logic to save either the non-inverted or inverted versions of the ADC output based on the slope-identifier bit 720. In one embodiment, these include an inverter 712 (NOT gate) and a multiplexer 714.

Figure 9:
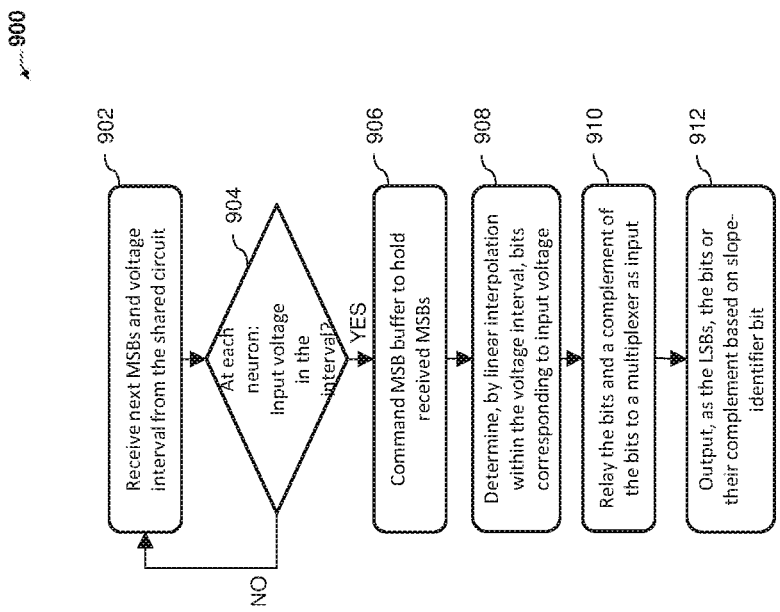
FIG. 9 is a process flow diagram for the per-neuron circuit 420 depicted in FIG. 8.

FIG. 9 depicts a flowchart of an example for determining LSBs by the per-neuron circuits according to one or more embodiments of the present invention. Here, the method 900 includes receiving the input data from the shared circuit 410, at block 902. The input data includes at least the MSBs 464 and the voltage interval 525. In one or more embodiments of the present invention, the input also includes a slope-identifier bit 720 that identifies a slope of the activation function 510 in this interval. In the case of an activation function 510 that is monotonic, the slope-identifier bit 720 is set to a default value, e.g., 0, that is indicative of an ascending slope (or descending slope). In the case of non-monotonic functions, the slope-identifier bit 720 varies between 0 and 1 to indicate the ascending slope and the descending slope respectively. It is understood that in one or more embodiments of the present invention, 0 and 1 can swap roles, relative to their roles in the examples here. The slope-identifier bit 720 is determined by the controller 412 based on the LUT 416.

The per-neuron circuit 420, as described earlier, determines if the input voltage $V_N$ is in the received voltage interval 525, at block 904. If the voltage interval $V_N$ is in the voltage interval (i.e., $V_L \leq V_N \leq V_H$), the MSBs are latched in the MSB buffer 424, at block 906. In addition, the ADC 426 generates the LSBs within the voltage interval 525, at block 908. The output of the ADC 426 and a 1's complement of the output (i.e., a NOT of the output) are both passed to the multiplexer 714, at block 910. The inverter 712 inverts the output of the ADCs 424.

The multiplexer 714 outputs, as the LSBs, either the output of the ADC 424 or the complement of the output based on the slope-identifier bit 720, at block 912. The slope-identifier bit 720 is input to the per-neuron circuits 420, along with the MSBs and the voltage interval 525, as described earlier. If the slope-identifier bit 720 indicates an ascending slope, the output bits from the ADC 424 are output as the LSBs, and the complement is output as the LSBs otherwise. It is understood that the inverter and multiplexer logic shown here for slope inversion is just one embodiment. Those skilled in the art may be able to use other standard logic circuits to achieve the same functionality.

It should be noted that in the case of non-monotonic activation function 510, the number of output intervals is lower than the input intervals. For example, in FIG. 8, 17 LUT entries define 8 output intervals and 3 MSB bits. Thus, to achieve the same MSB precision as a monotonic function, the system 400 uses more entries in the LUT 416, which increases the total conversion time. Nevertheless, the ability to directly implement non-monotonic functions without needing to use dedicated digital hardware is critical, especially for ANN backpropagation and training.

Accordingly, embodiments of the present invention provide a fast, flexible and area-efficient neuron implementation that combines analog-to-digital conversion together with in situ arbitrary function mapping. The activation function is split into a common or shared circuit components that are shared across all neurons in the layer, together with per-neuron area efficient dedicated circuits. The common circuit components are responsible for determining the overall shape of the function, or equivalently, determining the MSBs/intervals for all the neuron activations. These components can be reconfigured to implement different activation functions, monotonic and non-monotonic, using the same hardware by reconfiguring the information stored in a look-up table in the shared circuit. Smaller per-neuron dedicated circuits are responsible for determining the LSBs of the neuron activation, by implementing linear interpolation between the intervals defined by the common circuitry. The per-neuron circuitry can operate asynchronously with respect to the common circuits, allowing for highly parallelized operation across all neurons.

Inventors have noted that one or more embodiments of the present invention facilitate an area efficient technical solution that also improves on factors such as conversion time and power consumption. Accordingly, embodiments of the present invention provide a practical application and improvement to computing technology, particularly to neural network systems, by improving calculations of the activation function.

Figure 10:
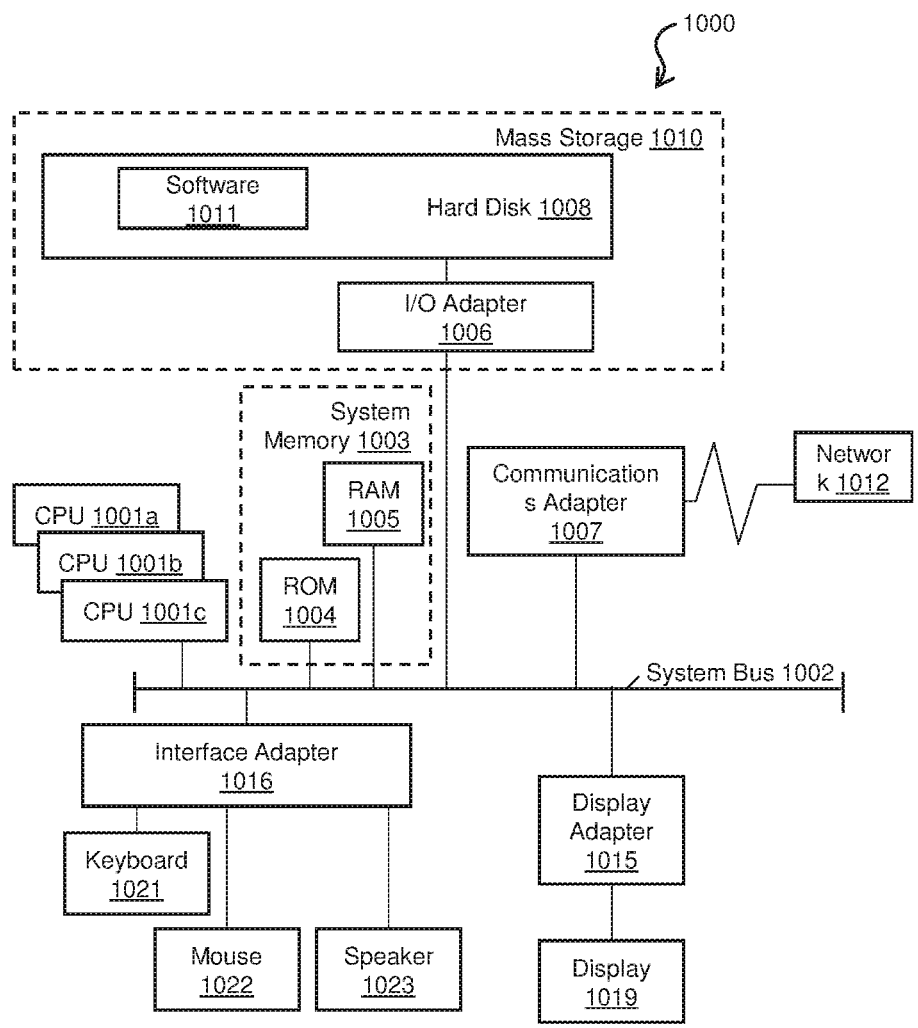
FIG. 10 depicts a computer system according to one or more embodiments of the present invention.

Turning now to FIG. 10, a computer system 1000 is generally shown in accordance with an embodiment. The computer system 1000 can be used as the neuron control system 102 in one or more embodiments of the present invention. The computer system 1000 can be an electronic, computer framework comprising and/or employing any number and combination of computing devices and networks utilizing various communication technologies, as described herein. The computer system 1000 can be easily scalable, extensible, and modular, with the ability to change to different services or reconfigure some features independently of others. The computer system 1000 may be, for example, a server, desktop computer, laptop computer, tablet computer, or smartphone. In some examples, computer system 1000 may be a cloud computing node. Computer system 1000 may be described in the general context of computer system executable instructions, such as program modules, being executed by a computer system. Generally, program modules may include routines, programs, objects, components, logic, data structures, and so on that perform particular tasks or implement particular abstract data types. Computer system 1000 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 10, the computer system 1000 has one or more central processing units (CPU(s)) 1001*a*, 1001*b*, 1001*c*, etc. (collectively or generically referred to as processor(s) 1001). The processors 1001 can be a single-core processor, multi-core processor, computing cluster, or any number of other configurations. The processors 1001, also referred to as processing circuits, are coupled via a system bus 1002 to a system memory 1003 and various other components. The system memory 1003 can include a read only memory (ROM) 1004 and a random access memory (RAM) 1005. The ROM 1004 is coupled to the system bus 1002 and may include a basic input/output system (BIOS), which controls certain basic functions of the computer system 1000. The RAM is read-write memory coupled to the system bus 1002 for use by the processors 1001. The system memory 1003 provides temporary memory space for operations of said instructions during operation. The system memory 1003 can include random access memory (RAM), read only memory, flash memory, or any other suitable memory systems.

The computer system 1000 comprises an input/output (I/O) adapter 1006 and a communications adapter 1007 coupled to the system bus 1002. The I/O adapter 1006 may be a small computer system interface (SCSI) adapter that communicates with a hard disk 1008 and/or any other similar component. The I/O adapter 1006 and the hard disk 1008 are collectively referred to herein as a mass storage 1010.

Software 1011 for execution on the computer system 1000 may be stored in the mass storage 1010. The mass storage 1010 is an example of a tangible storage medium readable by the processors 1001, where the software 1011 is stored as instructions for execution by the processors 1001 to cause the computer system 1000 to operate, such as is described herein below with respect to the various Figures. Examples of computer program product and the execution of such instruction is discussed herein in more detail. The communications adapter 1007 interconnects the system bus 1002 with a network 1012, which may be an outside network, enabling the computer system 1000 to communicate with other such systems. In one embodiment, a portion of the system memory 1003 and the mass storage 1010 collectively store an operating system, which may be any appropriate operating system, such as the z/OS or AIX operating system from IBM Corporation, to coordinate the functions of the various components shown in FIG. 10.

Additional input/output devices are shown as connected to the system bus 1002 via a display adapter 1015 and an interface adapter 1016 and. In one embodiment, the adapters 1006, 1007, 1015, and 1016 may be connected to one or more I/O buses that are connected to the system bus 1002 via an intermediate bus bridge (not shown). A display 1019 (e.g., a screen or a display monitor) is connected to the system bus 1002 by a display adapter 1015, which may include a graphics controller to improve the performance of graphics intensive applications and a video controller. A keyboard 1021, a mouse 1022, a speaker 1023, etc. can be interconnected to the system bus 1002 via the interface adapter 1016, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI). Thus, as configured in FIG. 10, the computer system 1000 includes processing capability in the form of the processors 1001, and, storage capability including the system memory 1003 and the mass storage 1010, input means such as the keyboard 1021 and the mouse 1022, and output capability including the speaker 1023 and the display 1019.

In some embodiments, the communications adapter 1007 can transmit data using any suitable interface or protocol, such as the internet small computer system interface, among others. The network 1012 may be a cellular network, a radio network, a wide area network (WAN), a local area network (LAN), or the Internet, among others. An external computing device may connect to the computer system 1000 through the network 1012. In some examples, an external computing device may be an external webserver or a cloud computing node.

It is to be understood that the block diagram of FIG. 10 is not intended to indicate that the computer system 1000 is to include all of the components shown in FIG. 10. Rather, the computer system 1000 can include any appropriate fewer or additional components not illustrated in FIG. 10 (e.g., additional memory components, embedded controllers, modules, additional network interfaces, etc.). Further, the embodiments described herein with respect to computer system 1000 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

The present invention may be a system, a method, and/or a computer program product at any possible technical detail level of integration. The computer program product may include a computer-readable storage medium (or media) having computer-readable program instructions thereon for causing a processor to carry out aspects of the present invention.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present invention may be assembler instructions, instruction-set-architecture (ISA) instructions, machine instructions, machine-dependent instructions, microcode, firmware instructions, state-setting data, configuration data for integrated circuitry, or either source-code or object code written in any combination of one or more programming languages, including an object-oriented programming language such as Smalltalk, C++, or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instruction by utilizing state information of the computer-readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other devices to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

What is claimed is:

1. A method for analog-to-digital conversion with reconfigurable function mapping for acceleration of calculating an activation function of a neural network system, the method comprising:

initializing the neural network system with a set of input neurons, a first array of resistive processing units (RPUs), a set of hidden neurons, a second array of RPUs, and a set of output neurons, wherein the first array of RPUs is communicatively coupled to the input neurons and the hidden neurons, and wherein the second array of RPUs is communicatively coupled to the hidden neurons and the output neurons;

determining, by a shared circuit of the neural network system, a set of voltage intervals, said voltage intervals saved as digital bits in a look-up table, and defining a shape of the activation function being mapped, wherein the shared circuit is common to two or more neurons;

determining, by the shared circuit, a set of most significant bits for each voltage interval by storing additional bits in the look-up table corresponding to each voltage interval entry;

sending, by the shared circuit, to each per-neuron circuit from a plurality of per-neuron circuits of the neural network system, the set of most significant bits and respective voltage intervals based on the look-up table, wherein each per-neuron circuit is unique to a single neuron;

determining, by each of the per-neuron circuits, whether corresponding accumulated input voltage is in a received voltage interval, and in response to the input voltage being in the received voltage interval, signaling a storage device, in each per-neuron circuit, to store the set of most significant bits;

determining, by each of the per-neuron circuits, a set of least significant bits by performing a linear interpolation over the received voltage interval; and outputting, by each of the per-neuron circuits, the set of most significant bits and the set of least significant bits as a result of the activation function with analog-to-digital conversion.

2. The method of claim 1, wherein, the digital bits are converted into analog voltages by using a digital-to-analog converter, a voltage interval being a voltage range between successive analog voltages.

3. The method of claim 1, wherein in the case of a monotonic activation function, the set of most significant bits corresponding to each voltage interval is determined by a counter that steps through the addresses of the look-up interval.

4. The method of claim 1, wherein in the case of a non-monotonic activation function, a slope-identifier bit is included in each entry in the look-up table to determine if the activation function is increasing or decreasing in a particular voltage interval.

5. The method of claim 4, wherein the slope-identifier bit inverts the least significant bits in response to the activation function being decreasing in the voltage interval.

6. The method of claim 1, wherein the linear interpolation is performed by an analog-to-digital converter using the voltage interval as voltage references for a successive approximation register (SAR).

7. The method of claim 6, wherein the linear interpolation is performed by an analog-to-digital converter using a fixed range, and wherein input voltage is scaled to the fixed range.

8. A system comprising:
a set of input neurons;
a first array of resistive processing units (RPUs);
a set of hidden neurons, wherein the first array of RPUs is communicatively coupled to the input neurons and the hidden neurons;
a second array of RPUs;
a set of output neurons, wherein the second array of RPUs is communicatively coupled to the hidden neurons and the output neurons;
a plurality of per-neuron circuits, wherein each per-neuron circuit is unique to a single neuron; and
a shared circuit that is common to two or more of the neurons, the shared circuit coupled with the plurality of per-neuron circuits;
wherein the shared circuit and the per-neuron circuits are configured to perform an analog-to-digital conversion with reconfigurable function mapping that accelerates calculating an activation function of a neural network system;
wherein the shared circuit is configured to determine a set of voltage intervals, said voltage intervals saved as digital bits in a look-up table, and define a shape of the activation function being mapped;
wherein the shared circuit is configured to determine a set of most significant bits for each voltage interval by storing additional bits in the look-up table corresponding to each voltage interval entry;
wherein the shared circuit is configured to send, to each per-neuron circuit, the set of most significant bits and respective voltage intervals based on the look-up table;
wherein each of the per-neuron circuits are configured to determine whether a corresponding accumulated input voltage is in a received voltage interval, and in response to the input voltage being in the received voltage interval, to signal a storage device, in each per-neuron circuit, to store the set of most significant bits;
wherein each of the per-neuron circuits is configured to determine a set of least significant bits by performing a linear interpolation over the received voltage interval; and
wherein each of the per-neuron circuits is configured to output the set of most significant bits and the set of least significant bits as a result of the activation function with analog-to-digital conversion.

9. The system of claim 8, wherein, the digital bits are converted into analog voltages by using a digital-to-analog converter, a voltage interval being voltage range between successive analog voltages.

10. The system of claim 8, wherein in the case of a monotonic activation function, the set of most significant bits corresponding to each voltage interval is determined by a counter that steps through the addresses of the look-up interval.

11. The system of claim 8, wherein in the case of a non-monotonic activation function, a slope-identifier bit is included in each entry in the look-up table to determine if the activation function is increasing or decreasing in a particular voltage interval.

12. The system of claim 11, wherein the slope-identifier bit inverts the least significant bits in response to the activation function being decreasing in the voltage interval.

13. The system of claim 8, wherein the linear interpolation is performed by an analog-to-digital converter using the voltage interval as voltage references for a successive approximation register (SAR).

14. The system of claim 13, wherein the linear interpolation is performed by an analog-to-digital converter using a fixed range, and wherein input voltage is scaled to the fixed range.

* * * * *